United States Patent
Hara et al.

(10) Patent No.: US 10,163,819 B2
(45) Date of Patent: Dec. 25, 2018

(54) SURFACE MOUNT PACKAGE AND MANUFACTURING METHOD THEREOF

(71) Applicant: NATIONAL INSTITUTE OF ADVANCED INDUSTRIAL SCIENCE AND TECHNOLOGY, Chiyoda-ku, Tokyo (JP)

(72) Inventors: Shiro Hara, Tsukuba (JP); Sommawan Khumpuang, Tsukuba (JP); Fumito Imura, Tsukuba (JP); Michihiro Inoue, Tosu (JP); Arami Saruwatari, Tosu (JP)

(73) Assignee: NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 0 days.

(21) Appl. No.: 15/529,072

(22) PCT Filed: Nov. 24, 2015

(86) PCT No.: PCT/JP2015/082846
§ 371 (c)(1),
(2) Date: Oct. 6, 2017

(87) PCT Pub. No.: WO2016/084768
PCT Pub. Date: Jun. 2, 2016

(65) Prior Publication Data
US 2018/0025994 A1    Jan. 25, 2018

(30) Foreign Application Priority Data

Nov. 27, 2014 (JP) ................................. 2014-239967

(51) Int. Cl.
*H01L 23/00* (2006.01)
*H01L 23/12* (2006.01)
(Continued)

(52) U.S. Cl.
CPC ........ *H01L 23/562* (2013.01); *H01L 21/4853* (2013.01); *H01L 21/4871* (2013.01);
(Continued)

(58) Field of Classification Search
None
See application file for complete search history.

(56) References Cited

U.S. PATENT DOCUMENTS 8,217,509 B2 * 7/2012 Horiuchi ............. H01L 23/5389
257/692
2005/0085009 A1    4/2005 Yamaguchi et al.
(Continued)

FOREIGN PATENT DOCUMENTS

JP    H0922961 A    1/1997
JP    2000311841 A   11/2000
(Continued)

OTHER PUBLICATIONS

Notification of Transmittal of Translation of the International Preliminary Report on Patentability (PCT/IB/338) dated Jun. 8, 2017, with International Preliminary Report on Patentability (PCT/IB/373) and Written Opinion of the International Searching Authority (PCT/ISA/237), for corresponding international application PCT/JP2015/082846.
(Continued)

*Primary Examiner* — Lex Malsawma
(74) *Attorney, Agent, or Firm* — Law Office of Katsuhiro Arai (57) ABSTRACT

A method for manufacturing a surface-mount type package whose face parallel with the semiconductor chip surface has a circular cross-section, is characterized by including at least the following steps in this order: a first step in which a semiconductor chip is bonded onto a circular support substrate; a second step in which the semiconductor chip is
(Continued)

sealed with resin; a third step in which the resin covering the pads of the semiconductor chip is removed; a fourth step in which a rewiring layer is formed; and a fifth step in which bumps are formed. The method can provide a surface-mount type package for semiconductor chips which is resistant to failures caused by thermal stress.

14 Claims, 6 Drawing Sheets

(51) Int. Cl.
    *H01L 21/48*     (2006.01)
    *H01L 21/56*     (2006.01)
    *H01L 23/31*     (2006.01)
    *H01L 23/367*     (2006.01)
    *H01L 23/538*     (2006.01)
    *H01L 23/29*     (2006.01)

(52) U.S. Cl.
CPC ............ *H01L 21/563* (2013.01); *H01L 23/12* (2013.01); *H01L 23/3114* (2013.01); *H01L 23/3128* (2013.01); *H01L 23/3675* (2013.01); *H01L 23/5386* (2013.01); *H01L 23/5389* (2013.01); *H01L 24/19* (2013.01); *H01L 24/20* (2013.01); *H01L 23/295* (2013.01); *H01L 23/296* (2013.01); *H01L 2224/04105* (2013.01); *H01L 2224/12105* (2013.01); *H01L 2224/214* (2013.01); *H01L 2224/32225* (2013.01); *H01L 2224/32245* (2013.01); *H01L 2224/73267* (2013.01); *H01L 2224/82039* (2013.01); *H01L 2224/83805* (2013.01); *H01L 2224/83851* (2013.01); *H01L 2224/92244* (2013.01); *H01L 2924/1033* (2013.01); *H01L 2924/10155* (2013.01); *H01L 2924/10252* (2013.01); *H01L 2924/10253* (2013.01); *H01L 2924/10254* (2013.01); *H01L 2924/10272* (2013.01); *H01L 2924/10329* (2013.01); *H01L 2924/1203* (2013.01); *H01L 2924/1301* (2013.01); *H01L 2924/1304* (2013.01); *H01L 2924/14* (2013.01); *H01L 2924/1432* (2013.01); *H01L 2924/1461* (2013.01); *H01L 2924/35121* (2013.01)

(56) References Cited

U.S. PATENT DOCUMENTS

| | | |
|---|---|---|
| 2006/0124347 A1 | 6/2006 | Takaike |
| 2013/0075924 A1 | 3/2013 | Lin et al. |
| 2013/0167339 A1 | 7/2013 | Hara et al. |
| 2015/0130028 A1* | 5/2015 | Asano .................... H01L 21/78 257/620 |
| 2015/0364432 A1* | 12/2015 | Chung .................. H01L 23/562 257/621 |

FOREIGN PATENT DOCUMENTS

| | | |
|---|---|---|
| JP | 2002050721 A | 2/2002 |
| JP | 2005038944 A | 2/2005 |
| JP | 2005109156 A | 4/2005 |
| JP | 2006196865 A | 7/2006 |
| JP | 2009194322 A | 8/2009 |
| JP | 2012054414 A | 3/2012 |
| JP | 2012209317 A | 10/2012 |
| JP | 2014179429 A | 9/2014 |

OTHER PUBLICATIONS

International Search Report (ISR) dated Dec. 22, 2015, issued for International application No. PCT/JP2015/082846.
A Notification of Reasons for Refusal issued by the Japanese Patent Office, dated Jan. 30, 2018, for Japanese counterpart application No. 2016-561572.
A Decision of Refusal issued by the Japanese Patent Office, dated May 29, 2018, for Japanese counterpart application No. 2016-561572.

* cited by examiner

SURFACE MOUNT PACKAGE AND MANUFACTURING METHOD THEREOF

This application is the U.S. National Phase under 35 U.S.C. § 371 of International Application PCT/JP2015/082846, filed Nov. 24, 2015, which claims priority to Japanese Patent Application No. 2014-239967, filed Nov. 27, 2014. The International Application was published under PCT Article 21(2) in a language other than English.

TECHNICAL FIELD

The present invention relates to a surface-mount type package for semiconductor chips, as well as a method for manufacturing such package.

BACKGROUND ART

Semiconductor chips are generally manufactured through a wafer process, known as a "front-end process," where wirings are formed on a circular silicon wafer of 200 mm to 300 mm in diameter, and a back-end process where the wafer is diced into individual chips. The silicon wafer, on which patterns are formed for the many semiconductor chips to be created from it, is diced in such a way that it is cut in one direction with a diamond blade, and then turned by 90 degrees and cut again in one direction, producing rectangular cuttings that become semiconductor chips.

The semiconductor chips that were cut from the wafer in the dicing process go through an assembly process, known as a "back-end process," involving mounting, wire-bonding, molding, etc., and an inspection process, and are then shipped as semiconductor packages. Semiconductor packages include the lead insertion types such as DIP (dual inline package), SIP (single inline package) and ZIP (zigzag inline package), as well as the surface-mounting types such as SOP (small outline package), QFP (quad flat package), QFN (quad flat no-lead package), BGA (ball grid array) and LGA (land grid array), where the surface-mounting types having smaller area are the current mainstream. A number of semiconductor packages have been devised to date, but semiconductor packages generally have a rectangular shape.

Semiconductor packages are subject to interfacial micro-delamination because shearing force is applied to the interface of different materials due to difference in their thermal expansion coefficients. When heat is applied to a semiconductor package, the moisture absorbed by the resin is ejected into micro-delamination areas as water vapor, and the pressures in the delamination areas increase and the package expands as a result. With a rectangular semiconductor package, this stress (thermal stress) due to expansion concentrates at the corners and therefore delamination tends to occur at the corners. Accordingly, rectangular semiconductor packages are designed with lower electrode and wiring density at the corners to reduce the amount of heat generating at the corners, as described in Patent Literature 1; however, it is difficult to completely prevent thermal-stress-induced delamination at the corners of CPUs, power semiconductors, and other packages generating a lot of heat, or in-vehicle semiconductor packages whose temperature rises to 60° C. or so in summer.

BACKGROUND ART LITERATURE

Patent Literature

[Patent Literature 1] Japanese Patent Laid-open No. Hei 9-22961

SUMMARY OF THE INVENTION

Problems to Be Solved By the Invention

An object of the present invention is to provide a surface-mount type package for semiconductor chips which is resistant to failures caused by thermal stress.

Means for Solving the Problems

1. A method for manufacturing a surface-mount type package whose face parallel with the semiconductor chip surface has a circular cross-section, wherein such method is characterized in that it comprises at least the following steps in this order:
    a first step in which a semiconductor chip is bonded onto a circular support substrate;
    a second step in which the semiconductor chip is sealed with resin;
    a third step in which the resin covering the pads of the semiconductor chip is removed;
    a fourth step in which a rewiring layer is formed; and
    a fifth step in which bumps are formed.
2. A method for manufacturing a surface-mount type package according to 1, characterized in that the support substrate is not sealed with resin in the second step.
3. A method for manufacturing a surface-mount type package according to 1 or 2, characterized in that the semiconductor chip is rectangular.
4. A method for manufacturing a surface-mount type package according to 1 or 2, characterized in that the semiconductor chip is circular.
5. A method for manufacturing a surface-mount type package according to 4, characterized in that the diameter of the semiconductor chip is 0.5 inches.
6. A method for manufacturing a surface-mount type package according to any one of 1 to 5, characterized in that multiple semiconductor chips are sealed on one surface-mount type package.
7. A method for manufacturing a surface-mount type package according to any one of 4 to 6, characterized in that the package is a CSP (chip size package).
8. A method for manufacturing a surface-mount type package according to any one of 1 to 7, characterized in that the bumps are placed with equal spacing in a manner forming a circle on the bottom face of the surface-mount type package.
9. A method for manufacturing a surface-mount type package according to any one of 1 to 8, characterized in that the pads are placed with equal spacing in a manner forming a circle.
10. A method for manufacturing a surface-mount type package according to any one of 1 to 9, characterized in that the wiring patterns in the rewiring layer are formed by curved lines, straight lines, or both.
11. A surface-mount type package characterized in that:
    bumps, a rewiring layer, a semiconductor chip, and a support substrate are stacked together in this order;
    at least the side face of the semiconductor chip is covered with a sealing resin part; and
    the face parallel with the semiconductor chip surface has a circular cross-section.
12. A surface-mount type package according to 11, characterized in that the support substrate is exposed on a surface thereof.

13. A surface-mount type package according to 11 or 12, characterized in that the semiconductor chip is rectangular.
14. A surface-mount type package according to 11 or 12, characterized in that the semiconductor chip is circular.
15. A surface-mount type package according to 14, characterized in that the diameter of the semiconductor chip is 0.5 inches.
16. A surface-mount type package according to any one of 11 to 15, characterized in that multiple semiconductor chips are sealed.
17. A surface-mount type package according to any one of 14 to 16, characterized in that it is a CSP (chip size package).
18. A surface-mount type package according to any one of 11 to 17, characterized in that the bumps are placed with equal spacing in a manner forming a circle on the bottom face of the surface-mount type package.
19. A surface-mount type package according to any one of 11 to 18, characterized in that the pads of the semiconductor chip are placed with equal spacing in a manner forming a circle.
20. A surface-mount type package according to any one of 11 to 19, characterized in that the wiring patterns in the rewiring layer are formed by curved lines, straight lines, or both.

Effects of the Invention

A surface-mount type package resistant to failures caused by thermal stress can be manufactured according to the manufacturing method proposed by the present invention. The surface-mount type package obtained by the manufacturing method proposed by the present invention has a circular cross-section for its face parallel with the semiconductor chip surface, and has no corners where failures tend to occur, and therefore it is resistant to failures caused by thermal stress. In addition, the surface-mount type package has excellent radiation performance, because it incorporates a support substrate that has been bonded with the semiconductor chip during manufacturing and this support substrate acts as a heat sink. Furthermore, the radiation performance can be enhanced further by exposing this support substrate on a surface of the semiconductor package. The surface-mount type package obtained by the manufacturing method proposed by the present invention has no corners where failures tend to occur due to thermal stress, and also has excellent radiation performance, and therefore it exhibits markedly excellent durability and reliability.

If a rectangular semiconductor chip is to be sealed on the surface-mount type package obtained by the manufacturing method proposed by the present invention, a rectangular semiconductor chip created in any traditional pre-process can be used and thus cost can be reduced. Also, when a circular semiconductor chip is sealed, the thickness of the sealing resin part on the side face of the semiconductor chip can be made uniform, which in turn allows the thermal stress to apply uniformly to the sealing resin part.

By arranging the bumps, pads, or both, in a circular pattern, the heat and thermal stress that generate when power is supplied can be distributed uniformly over the entire surface-mount type package. Also, by using wiring patterns that are formed by curved lines, straight lines, or both, the lengths of conductive parts become shorter and the heat and thermal stress that generate when power is supplied can be reduced, and furthermore, wire breakage, short circuits, and other wiring failures can be reduced.

DESCRIPTION OF THE SYMBOLS

1 Surface-mount type package
2 Bump
3 Rewiring layer
4 Semiconductor chip
5 Adhesive
6 Support substrate
7 Sealing resin part
8 Pad
9 Conductive part
10 Opening
11 Copper layer
12 Resist layer
13 Via hole
14 Solder resist
15 Solder ball

MODE FOR CARRYING OUT THE INVENTION

The surface-mount type package proposed by the present invention is characterized in that its face parallel with the semiconductor chip surface has a circular cross-section, and its exterior form is a cylinder, circular truncated cone, or combination thereof. Because its face parallel with the semiconductor chip surface has a circular cross-section, the surface-mount type package proposed by the present invention has no corners. Accordingly, the surface-mount type package proposed by the present invention is more resistant to failures caused by thermal stress, and exhibits superior durability and reliability, compared to conventional semiconductor packages.

Figure 1:
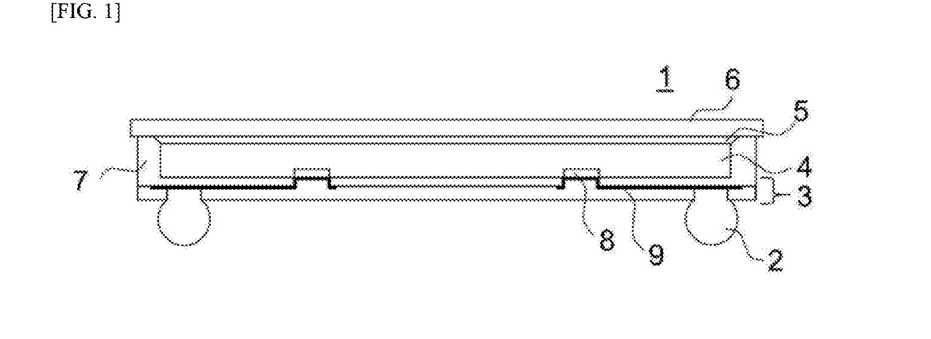
FIG. 1 A cross sectional view of an embodiment of a surface-mount type package obtained by the manufacturing method proposed by the present invention.

FIG. 1 shows a cross sectional view of an embodiment of a surface-mount type package obtained by the manufacturing method proposed by the present invention.

The surface-mount type package 1 shown in FIG. 1 comprises bumps 2, a rewiring layer 3, a semiconductor chip 4, adhesive 5, and a support substrate 6, which are stacked together in this order, and the support substrate 6 is exposed on a surface of the surface-mount type package 1. The face on the rewiring layer 3 side, and the side face, of the semiconductor chip 4, are covered with a sealing resin part 7. Pads 8 of the semiconductor chip 4 are not covered with the sealing resin part 7; instead, the pads 8 are electrically connected to the bumps 2 via conductive parts 9 of the rewiring layer 3. The support substrate 6 and sealing resin part 7 are arranged in such a way that their face parallel with the semiconductor chip surface has a circular cross-section and forms a concentric circle with the cross-section of the surface-mount type package.

It should be noted that the surface-mount type package shown in FIG. 1 is an example of a surface-mount type package obtained by the manufacturing method proposed by the present invention, and surface-mount type packages obtained by the manufacturing method proposed by the present invention are not limited to this constitution. For example, the semiconductor chip 4 and support substrate 6 may be eutectically bonded, the support substrate 6 may be entirely sealed with the sealing resin part 7, and multiple semiconductor chips 4 may be placed in parallel or stacked and sealed together.

Under the present invention, the support substrate is incorporated into the surface-mount type package in a state bonded to the semiconductor chip. The support substrate has a function to allow the heat generated by the semiconductor chip to spread throughout and escape from the package, and in this sense, it acts as a heat sink. The support substrate may be entirely sealed by the sealing resin part, but preferably it is exposed on a surface of the surface-mount type package as shown in FIG. 1. Exposing the support substrate on a surface of the surface-mount type package allows the heat to escape from the semiconductor chip to the air more efficiently. The material of the support substrate is not limited in any way, and copper, aluminum, stainless steel, iron, titanium, graphite, tantalum, zirconium, tungsten, molybdenum, 42 alloy, Invar alloy, Kovar alloy, glass, quartz, sapphire, glass epoxy, etc., may be used. Among the above, copper or aluminum offering excellent thermal conductivity, or 42 alloy, Invar alloy, or Kovar alloy whose thermal expansion coefficient is close to those of the ceramic materials from which semiconductor chips are formed, is preferred.

The type of the adhesive used to bond the support substrate and semiconductor chip is not limited in any way, but preferably it is of thermally conductive type. Any known thermally conductive adhesive can be used, such as one containing silver, alumina, aluminum nitride, or other material offering excellent thermal conductivity, for example.

The purpose of use of the surface-mount type package proposed by the present invention is not limited in any way, but it is suitable for CPUs (central processing units) and power semiconductors generating a lot of heat, or in-vehicle applications requiring durability at high temperatures.

The surface-mount type package proposed by the present invention is a BGA (ball grid array) package having spherical external electrodes known as "bumps" on its bottom face. BGA packages can achieve higher mounting yields, because bumps can be placed over the entire bottom face to maintain wide spacing between the bumps even when the number of bumps increases.

The shape of the semiconductor chip sealed on the surface-mount type package proposed by the present invention is not limited to a rectangle, which is a generally used shape, but it may be a hexagon or other polygon, or a circle. A circular semiconductor chip is preferred because the thickness of the sealing resin part on the side face of the semiconductor chip can be made uniform, thus making the thermal stress uniform. Examples of a circular semiconductor chip include the 0.5-inch-diameter semiconductor chip proposed by Japanese Patent Laid-open No. 2012-54414 or Japanese Patent Laid-open No. 2014-30034, but the wafer size is not limited thereto. Also, two or more semiconductor chips may be placed in parallel or stacked and sealed together.

The thickness of the sealing resin part that seals the circular semiconductor chip can be reduced to achieve a CSP (chip-size package). Here, it should be noted that the term "CSP," as used in this Specification, means that the thickness of the sealing resin part that seals the semiconductor chip is 0.05 mm or more, but 3 mm or less. The thickness of the sealing resin part is more preferably 0.05 mm or more, but 1 mm or less, or yet more preferably 0.05 mm or more, but 0.5 mm or less, or most preferably 0.05 mm or more, but 0.2 mm or less.

The ceramic material from which the semiconductor chip is formed is not limited in any way, and silicon, germanium, gallium arsenide, silicon carbide, gallium arsenide phosphide, gallium nitride, sapphire, diamond, etc., may be used. Also, the type of semiconductor chip to be sealed is not limited in any way, and an integrated circuit, large-scale integrated circuit, transistor, thyristor, diode, solid imaging element, MEMS chip, etc., may be used, for example.

The surface-mount type package proposed by the present invention is such that, since the sealing resin part that seals the semiconductor chip is formed in such a way that its face parallel with the semiconductor chip surface has a circular cross-section, the face of the surface-mount type package parallel with the semiconductor chip surface has a circular cross-section. The resin used for sealing the semiconductor chip under the present invention is not limited in any way, and any commercially available resin can be used without limitation. Generally, for resins to seal semiconductors with, epoxy compositions whose primary component is epoxy resin and which also contain phenol resin hardener, silica filler, or other inorganic filler are used; however, any phenol composition, silicon composition, etc., may also be used here without limitation.

Figure 2:
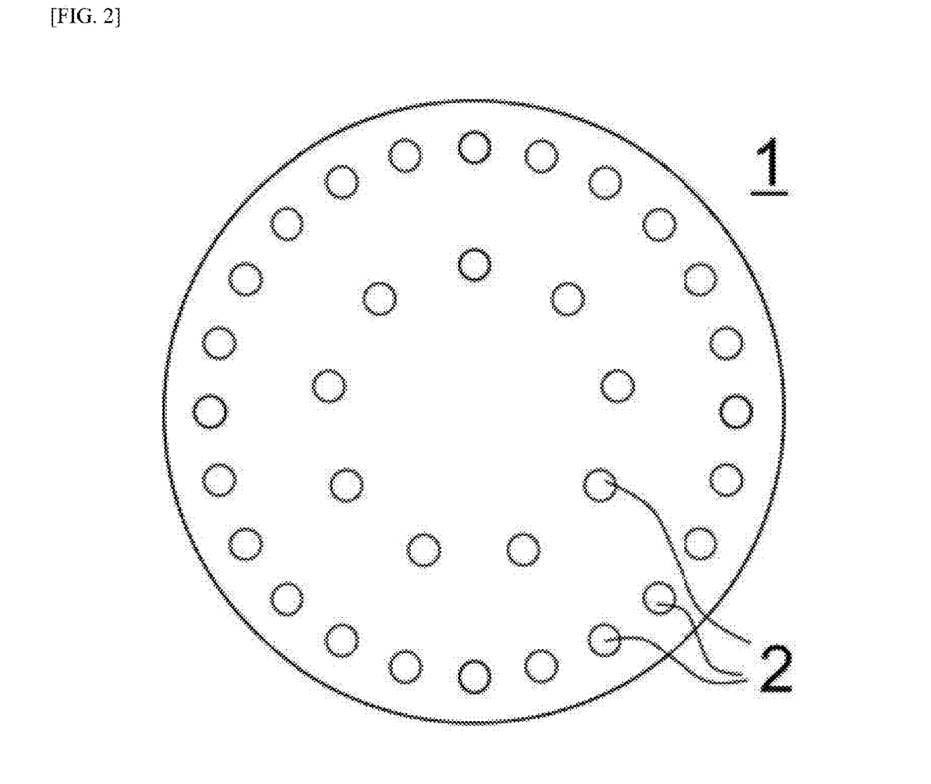
FIG. 2 A bottom view of an embodiment of a surface-mount type package obtained by the manufacturing method proposed by the present invention.

FIG. 2 shows a bottom view of an embodiment of a surface-mount type package obtained by the manufacturing method proposed by the present invention. With the surface-mount type package proposed by the present invention, the placement of the bumps that serve as external electrodes is not limited to a circular pattern at the bottom face of the package; instead, they may be placed randomly or in a grid pattern. It is preferable that the bumps are placed with equal spacing in a manner forming a circle, because then the bumps can be placed uniformly on the bottom face of the package, and consequently the heat and thermal stress that generate when power is supplied can be made uniform throughout the package. The bumps may be placed with equal spacing in a manner forming two or more circles on the bottom face of the package, or they may be formed at the center of a circle. In addition, preferably the circle formed by the bumps is concentric with the circular cross-section of the surface-mount type package. It should be noted that, in this Specification, the phrase "place in a manner forming a circle" means placing along the circumference of a circle. The material from which the bumps are formed is not limited in any way, and examples include solder, unleaded solder, gold, silver, copper, nickel, or the like.

With the semiconductor chip used for the surface-mount type package proposed by the present invention, the placement of the pads used for signal input/output is not limited in any way, either. It should be noted, however, that if the conductive parts that electrically connect the pads and bumps are significantly different in length, signal delays may occur and the generated heat and thermal stress will not distribute uniformly; therefore, preferably the pads and bumps are placed in similar forms in order to make the lengths of the conductive parts roughly equal. This means that, if the bumps are provided in a grid pattern, preferably the pads are also placed in a grid pattern; if the bumps are provided with equal spacing in a manner forming a circle, preferably the pads are also placed with equal spacing in a manner forming a circle. The pads may be placed in a manner forming two or more circles, or they may be formed at the center of a circle. In addition, preferably the circle formed by the pads is concentric with the circular cross-section of the surface-mount type package. The material from which the pads are formed is not limited in any way, and examples include aluminum, palladium, gold, silver, copper, or the like.

With the surface-mount type package proposed by the present invention, the conductive parts that connect the pads and bumps are formed in the rewiring step. By forming the conductive parts by means of rewiring, the surface-mount type package can be made smaller and thinner compared to when they are formed by means of wire-bonding or flip-chip bonding. Also, as long as the surface-mount type package proposed by the present invention has conducive parts by means of rewiring, the conductive parts formed by rewiring may be combined with conductive parts formed by other methods. If two or more semiconductor chips are stacked and sealed together, for example, the semiconductor chip in the bottom layer may be connected by means of rewiring, while the semiconductor chip(s) in the layer(s) above it may be connected by means of wire-bonding. The type of the metal from which the conductive parts are formed is not limited in any way, and aluminum, palladium, gold, silver, copper, etc., may be used. Preferably copper is used, because it is inexpensive and copper film can be formed easily by means of electroplating.

With the surface-mount type package proposed by the present invention, the wiring patterns in the rewiring layer are not limited in any way. The wiring patterns are designed by computer based on a set of conditions including wire width, spacing between adjacent wires, length of conductive parts, and wiring density, but normally wiring patterns consisting of straight lines intersecting at right angles are derived to facilitate calculations. Here, it should be noted that, while the conductive parts by means of rewiring are formed inside an interlayer insulation film, the conductive parts receive several hundred MPa of tensile stress due partly to the shearing force resulting from the difference between the thermal expansion coefficient of the metal from which the conductive parts are formed and that of the material from which the interlayer insulation film is formed, and due partly to the compressive stress that generates when the interlayer insulation film hardens. And, this tensile stress concentrates at the points of intersection of the straight lines intersecting at right angles. Also, electric fields are known to concentrate at points of intersection, and accordingly wire breakage, short circuits, and other wiring failures tend to occur at the points of intersection of the straight lines intersecting at right angles due to concentration of stress as well as concentration of electric fields.

Figure 3:
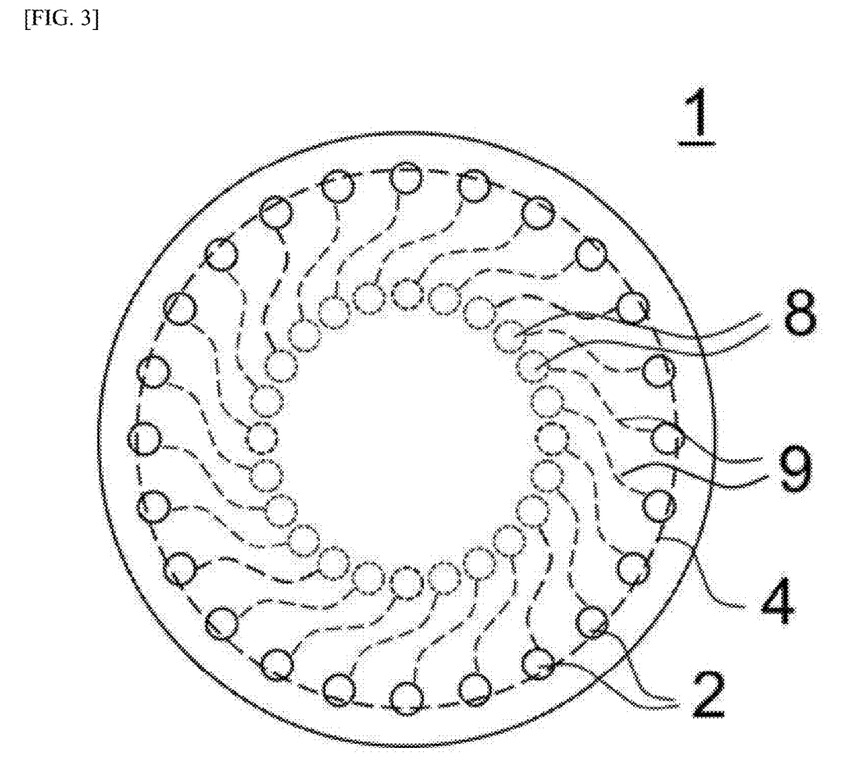
FIG. 3 A bottom view of a surface-mount type package obtained by the manufacturing method proposed by the present invention, where the conductive parts 9 connected to the pads 8 and bumps 2 are curved lines.
Figure 4:
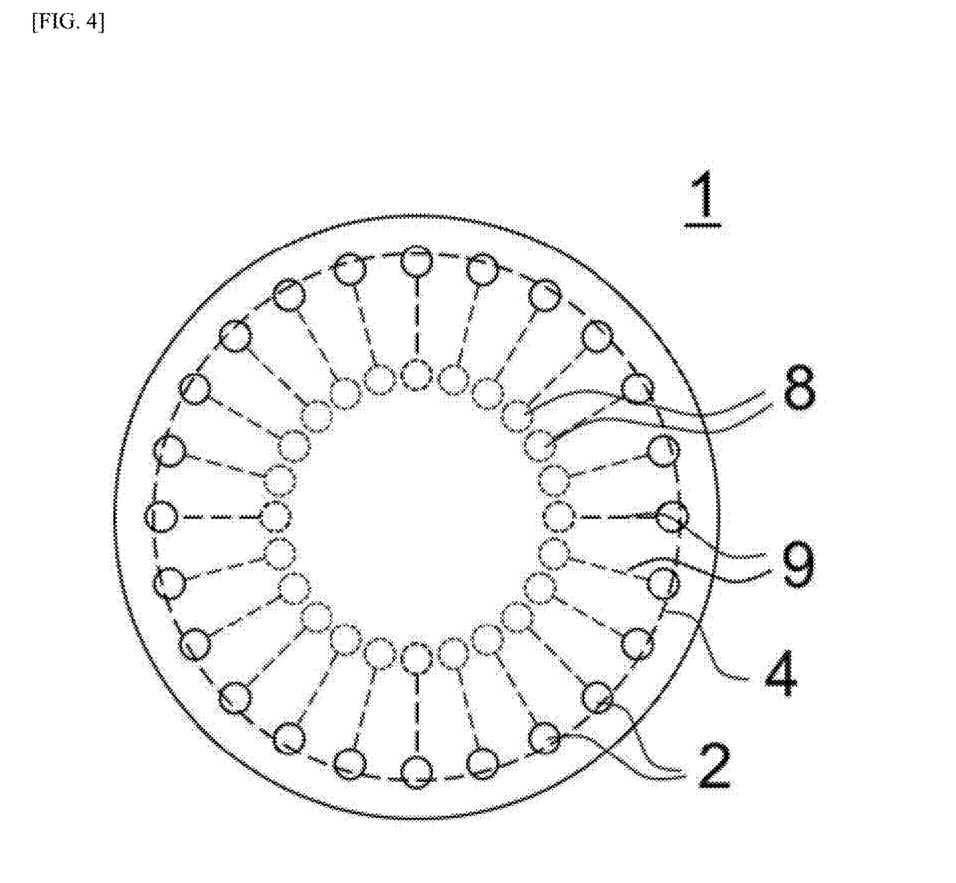
FIG. 4 A bottom view of a surface-mount type package obtained by the manufacturing method proposed by the present invention, where the conductive parts 9 connected to the pads 8 and bumps 2 are straight lines.

The surface-mount type package proposed by the present invention has no corners. While rectangular semiconductor chips require wiring designs that make the wiring density at the corners lower than that in other areas, the surface-mount type package proposed by the present invention eliminates the need to change the wiring density in each area and therefore offers a high degree of wiring design flexibility. Also, by placing the pads and bumps in similar forms, the wiring design conditions can be reduced substantially. As a result, even wiring patterns consisting of curved lines, which are difficult to calculate compared to wiring patterns that consist of straight lines intersecting at right angles, can be designed easily. Furthermore, by optimally placing the pads and bumps in similar forms, wiring patterns in which the pads and bumps are connected by straight lines can also be achieved. Compared to wiring patterns that consist of straight lines intersecting at right angles, wiring patterns consisting of curved lines, straight lines, or both, permit use of shorter conductive parts, and therefore the heat and thermal stress that generate at the conductive parts can be reduced. Furthermore, wiring patterns consisting of curved lines, straight lines, or both, have no points of intersection where wire breakage, short circuits or other wiring failures may occur, which in turn adds to durability and reliability. FIG. 3 shows a bottom view of a surface-mount type package whose wiring patterns consist of curved lines, while FIG. 4 shows a bottom view of a surface-mount type package whose wiring patterns consist of straight lines. In FIGS. 3 and 4, the dotted lines represent the circular semiconductor chip 4, pads 8, and conductive parts 9 constituting the internal structure of the surface-mount type package.

As mentioned above, the placement of the bumps and that of the pads are not limited in any way as far as the surface-mount type package proposed by the present invention is concerned; however, most preferably the bumps and pads are placed with equal spacing in a manner forming a circle which is concentric with the circular cross-section of the surface-mount type package, because this way the heat and thermal stress that generate when power is applied can be distributed uniformly throughout the entire surface-mount type package. Furthermore, such constitution facilitates the calculation of wiring patterns and therefore allows the wiring patterns to be formed by curved lines, straight lines, or both, while maintaining the conductive parts connecting the pads and bumps at a roughly uniform length. Since the conductive parts can be shorter when the wiring patterns are formed by curved lines, straight lines, or both, the heat and thermal stress can be reduced. Furthermore, such patterns are resistant to wire breakage, short circuits, etc., and thus the durability and reliability can be increased.

A manufacturing example of an embodiment of the surface-mount type package proposed by the present invention, as shown in FIG. 1, is explained below using FIGS. 5 to 14. It should be noted that this manufacturing example is only one example and the manufacturing method proposed by the present invention is not limited to this example.

(First Step in which a Semiconductor Chip is Bonded to a Circular Support Substrate)

Figure 5:
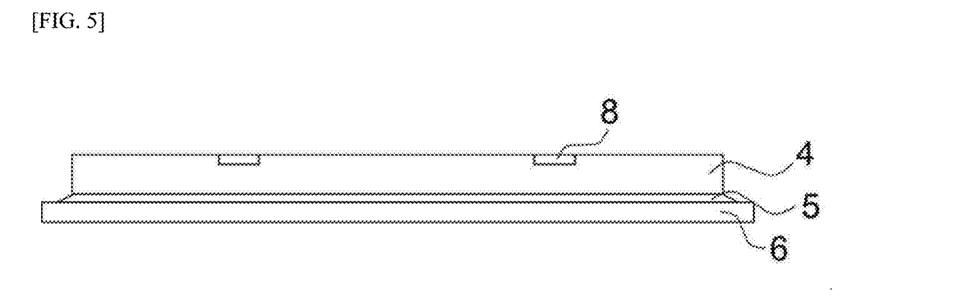
FIG. 5 A cross sectional view showing a method for manufacturing a surface-mount type package.

A circular silicon semiconductor chip 4 of 0.5 inches (12.5 mm) in diameter and 0.25 mm in thickness is bonded onto a circular support substrate 6 of 13.5 mm in diameter made of 42 alloy, in a manner concentric with the support substrate 6 using a thermally conductive adhesive 5 (FIG. 5).

The semiconductor chip 4 has multiple aluminum pads 8 placed on it with equal spacing in a manner forming a circle which is concentric with the circular semiconductor chip 4, and the semiconductor chip 4 is bonded so that the pads 8 constitutes the top face. On the completed surface-mount type package, the face of the support substrate 6 to which the semiconductor chip 4 is not bonded is exposed on a surface thereof and functions as a heat sink. Also, while one semiconductor chip is encapsulated in FIG. 5, two or more semiconductor chips may be stacked and encapsulated together.

(Second Step in which the Semiconductor Chip is Sealed with Resin)

Figure 6:
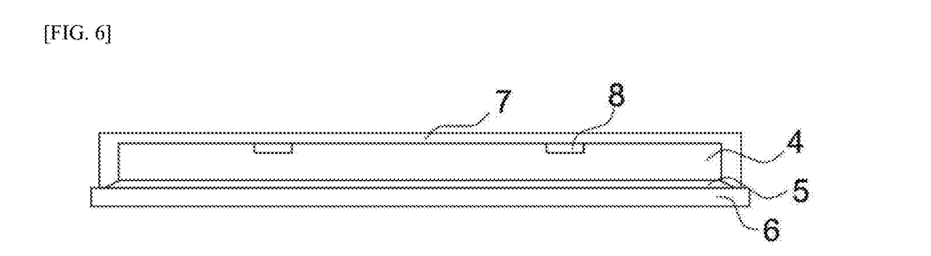
FIG. 6 A cross sectional view showing a method for manufacturing a surface-mount type package.

A die having a cylindrical concave of 12.8 mm in diameter and 0.4 mm in depth is pressed onto the support substrate 6 to form a cavity. Through molding, which involves pouring thermosetting resin into the cavity and curing it, a sealing resin part 7 that seals the top face and side face of the semiconductor chip 4 is formed (FIG. 6).

Here, the diameter of the support substrate 6 is larger than the diameter of the semiconductor chip 4 by only 1 mm, so the space between the outer periphery of the semiconductor chip 4 and the outer periphery of the support substrate 6 is 0.5 mm. In addition, the diameter of the die is 12.8 mm, which means that the gap between the semiconductor chip 4 and the die is 0.15 mm. Accordingly, the die contacts the support substrate 6 over a width of 0.35 mm within the gap of 0.5 mm between the semiconductor chip 4 and the support substrate 6. Since the support substrate 6 makes surface contact with the die, albeit over such narrow width of 0.35 mm, generation of burrs can be reduced.

(Third Step in which the Resin Covering the Pads of the Semiconductor Chip is Removed)

Figure 7:
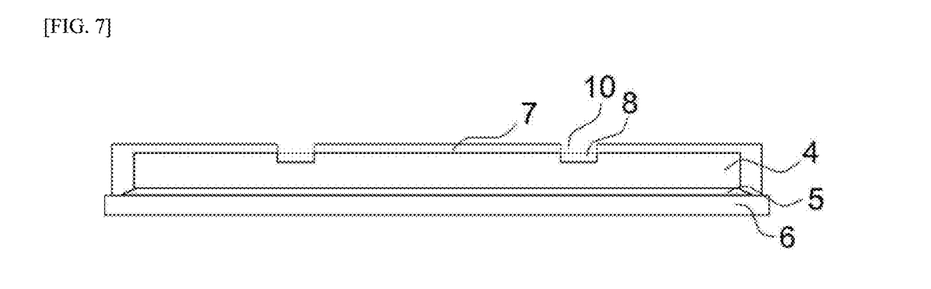
FIG. 7 A cross sectional view showing a method for manufacturing a surface-mount type package.

In the aforementioned second step, the top face of the semiconductor chip 4 is covered with the sealing resin part 7; accordingly, the resin covering the pads 8 which will be used to input and output signals to/from the semiconductor chip 4 is removed by means of laser abrasion, to form openings 10 (FIG. 7).

Normally, resins that are used to seal semiconductor chips 4 have black color to prevent malfunctioning caused by light. Under the present invention, however, the sealing resin part 7 is formed in a circular shape, and if the semiconductor chip 4 is covered with the sealing resin part 7 which is black in color and formed in a circular shape, the positions of the pads 8 can no longer be identified from the exterior. Accordingly, preferably in the aforementioned second step, a die having concave parts inside is used to form convex parts roughly at the positions where the pads 8 are partially covered by the sealing resin part 7. By associating the convex parts with the positions of the pads, the convex parts can be used to determine the laser abrasion positions. If the convex parts are provided on the pads, the convex parts can be removed when the openings 10 are formed. If the convex parts are provided in other positions, they can be removed by means of laser abrasion, if necessary, after the openings 10 have been formed.

(Fourth Step in which a Rewiring Layer is Formed)

A rewiring layer 3 having the conductive parts 9 for connecting the pads 8 with the bumps 2 that serve as external electrodes, is formed. To form the rewiring layer, any known step normally used for such purpose may be utilized. For example, the following step may be used.

Figure 8:
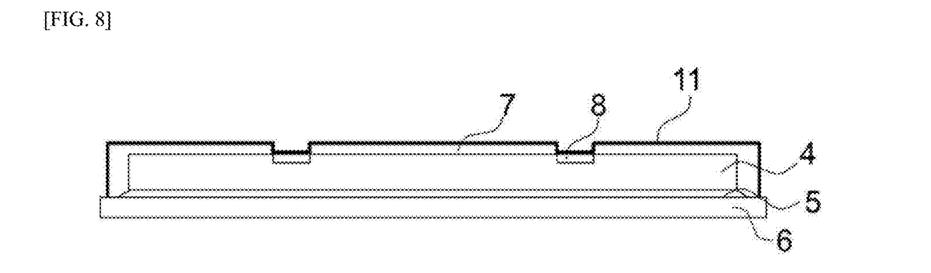
FIG. 8 A cross sectional view showing a method for manufacturing a surface-mount type package.
Figure 9:
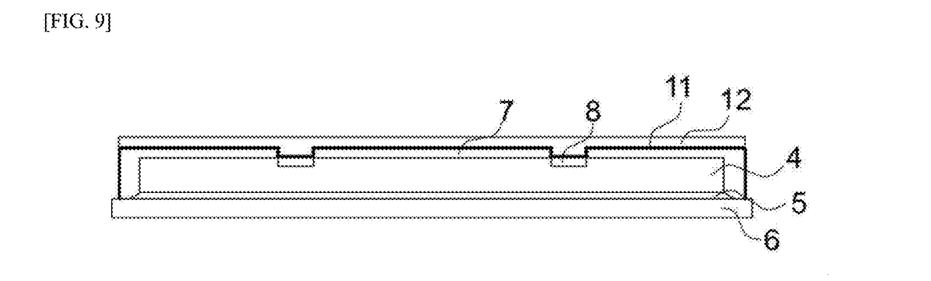
FIG. 9 A cross sectional view showing a method for manufacturing a surface-mount type package.
Figure 10:
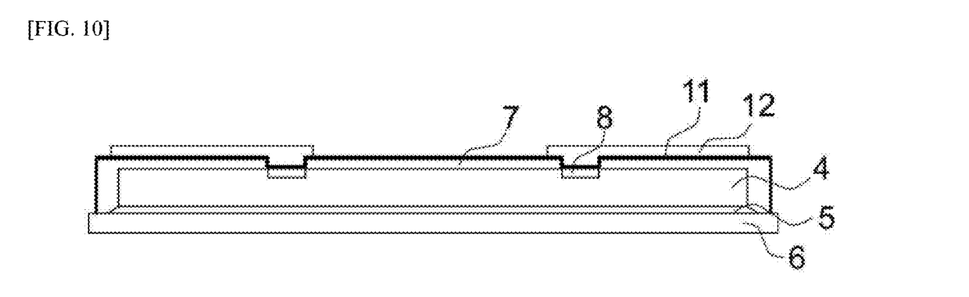
FIG. 10 A cross sectional view showing a method for manufacturing a surface-mount type package.

A copper layer 11 is formed by means of electroplating over the sealing resin part 7 and the pads 8 (FIG. 8). Since the sealing resin part 7 is nonconductive, electroplating is performed after a thin Cu seed layer has been formed by means of sputtering. It should be noted that, because the support substrate is formed by 42 alloy, a copper layer will be formed on the back side of the support substrate if electroplating is performed directly. Since it is not desirable from the viewpoint of appearance that a copper layer, that would turn greenish blue when rusted is formed on the back side of the support substrate that will become the outermost face of the package, preferably the back side of the support substrate is protected with masking tape, etc., to prevent a copper layer from forming.

Figure 11:
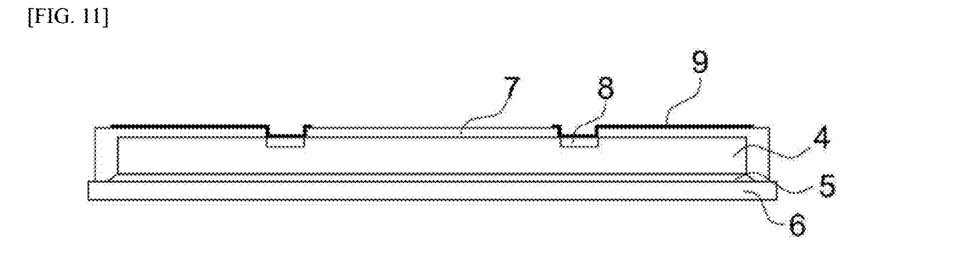
FIG. 11 A cross sectional view showing a method for manufacturing a surface-mount type package.
Figure 12:
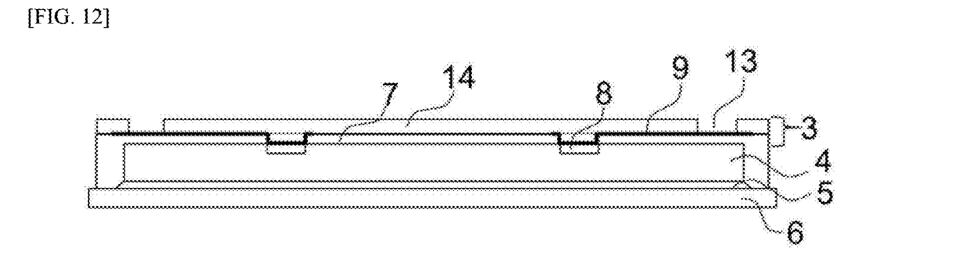
FIG. 12 A cross sectional view showing a method for manufacturing a surface-mount type package.

After the copper layer 11 has been formed, a resist layer 12 is formed (FIG. 9), resist patterns are formed by means of lithography (FIG. 10), and the copper layer 11 is etched using the resist patterns as masks, to form conductive parts 9 (FIG. 11). Furthermore, a solder resist 14 is applied using an inkjet printer, except over via holes 13 where solder balls will be placed, after which the solder resist is cured to form a rewiring layer 3 constituted by the sealing resin part 7 that seals the top face of the semiconductor chip, the conductive parts 9, and the solder resist 14 (FIG. 12). The wiring patterns in the rewiring layer 3 are formed by curved lines, straight lines, or both, while the via holes are provided with equal spacing in a manner forming a circle which is concentric with the circular cross-section of the surface-mount type package.

(Fifth Step in which Bumps are Formed)

Figure 13:
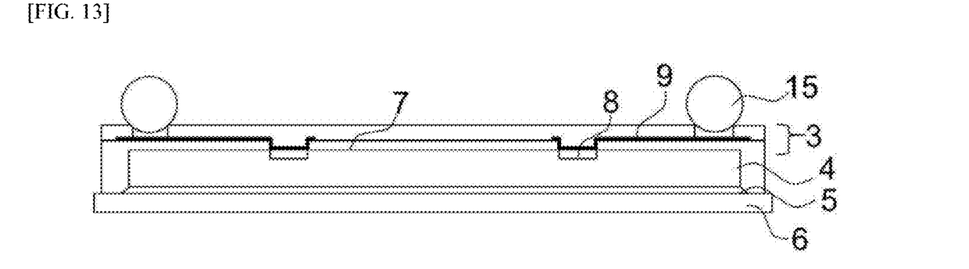
FIG. 13 A cross sectional view showing a method for manufacturing a surface-mount type package.
Figure 14:
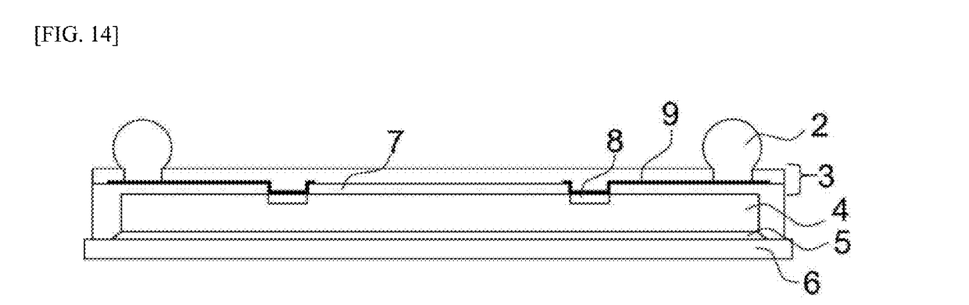
FIG. 14 A cross sectional view showing a method for manufacturing a surface-mount type package.

Solder balls 15 are placed on the via holes 13 using a ball-mounter (FIG. 13). The solder balls are heated with a reflow device and melted, to form bumps 2, while at the same time the bumps 2 and the pads 8 are electrically connected via the conductive parts 9 (FIG. 14).

It should be noted that, in addition to the aforementioned first through fifth steps, desmearing, after-curing, marking of the support substrate to be positioned on the outermost face of the semiconductor package, etc., can be performed as deemed appropriate.

What is claimed is:

1. A method for manufacturing a surface-mount type package whose face parallel with a semiconductor chip surface has a circular cross-section, characterized by comprising at least following steps in this order:
    a first step in which a semiconductor chip is bonded onto a circular support substrate;
    a second step in which the semiconductor chip is sealed with resin;
    a third step in which the resin covering pads of the semiconductor chip is removed;
    a fourth step in which a rewiring layer is formed; and
    a fifth step in which bumps are formed,
    wherein the package is a CSP (chip-size package),
    the semiconductor chip is circular with a diameter of 0.5 inches, and
    the resin for sealing the semiconductor chip has a thickness of 0.05 mm or more and 3.0 mm or less in a diametrical direction of the semiconductor chip.

2. A method for manufacturing a surface-mount type package according to claim 1, characterized in that the support substrate is not sealed with resin in the second step.

3. A method for manufacturing a surface-mount type package according to claim 1, characterized in that multiple semiconductor chips are sealed on one surface-mount type package.

4. A method for manufacturing a surface-mount type package according to claim 1, characterized in that the bumps are placed with equal spacing in a manner forming a circle on a bottom face of the surface-mount type package.

5. A method for manufacturing a surface-mount type package according to claim 1, characterized in that the pads are placed with equal spacing in a manner forming a circle.

6. A method for manufacturing a surface-mount type package according to claim 1, characterized in that wiring patterns in the rewiring layer are formed by curved lines, straight lines, or both.

7. The method according to claim 1, wherein the resin for sealing the semiconductor chip has a thickness of 0.05 mm or more and 0.5 mm or less in a diametrical direction of the semiconductor chip.

8. A surface-mount type package characterized in that bumps, a rewiring layer, a semiconductor chip, and a support substrate are stacked together in this order in a thickness direction; wherein:
   at least a side face of the semiconductor chip is covered with a sealing resin part; and
   a face parallel with a semiconductor chip surface has a circular cross-section,
   the package is a CSP (chip-size package),
   the semiconductor chip is circular with a diameter of 0.5 inches, and
   the resin part for sealing the semiconductor chip has a thickness of 0.05 mm or more and 3.0 mm or less in a diametrical direction of the semiconductor chip.

9. A surface-mount type package according to claim 8, characterized in that the support substrate is exposed on a surface thereof.

10. A surface-mount type package according to claim 8, characterized in that multiple semiconductor chips are sealed.

11. A surface-mount type package according to claim 8, characterized in that the bumps are placed with equal spacing in a manner forming a circle on a bottom face of the surface-mount type package.

12. A surface-mount type package according to claim 8, characterized in that pads of the semiconductor chip are placed with equal spacing in a manner forming a circle.

13. A surface-mount type package according to claim 8, characterized in that wiring patterns in the rewiring layer are formed by curved lines, straight lines, or both.

14. The surface-mount type package according to claim 8, wherein the resin for sealing the semiconductor chip has a thickness of 0.05 mm or more and 0.5 mm or less in a diametrical direction of the semiconductor chip.

\* \* \* \* \*